US007142992B1

(12) United States Patent
Huet et al.

(10) Patent No.: US 7,142,992 B1
(45) Date of Patent: Nov. 28, 2006

(54) FLEXIBLE HYBRID DEFECT CLASSIFICATION FOR SEMICONDUCTOR MANUFACTURING

(75) Inventors: Patrick Huet, San Jose, CA (US); Maruti Shanbhag, Bangalore (IN); Sandeep Bhagwat, Milpitas, CA (US); Michal Kowalski, Santa Cruz, CA (US); Vivekanand Kini, Sunnyvale, CA (US); David Randall, Sunnyvale, CA (US); Sharon McCauley, San Jose, CA (US); Tong Huang, Sunnyvale, CA (US); Jianxin Zhang, Santa Clara, CA (US); Kenong Wu, Davis, CA (US); Lisheng Gao, Morgan Hill, CA (US); Ariel Tribble, Fremont, CA (US); Ashok Kulkarni, San Jose, CA (US); Cecelia Anne Campochiaro, Sunnyvale, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 10/954,968

(22) Filed: Sep. 30, 2004

(51) Int. Cl.
*G01R 31/00* (2006.01)
*G06F 19/00* (2006.01)
(52) U.S. Cl. ........................................ 702/58
(58) Field of Classification Search ............. 702/58
See application file for complete search history.

(56) References Cited

U.S. PATENT DOCUMENTS

| | | | | |
|---|---|---|---|---|
| 5,544,256 A | * | 8/1996 | Brecher et al. | 382/149 |
| 5,822,218 A | * | 10/1998 | Moosa et al. | 716/4 |
| 6,092,059 A | | 7/2000 | Straforini | |
| 6,222,936 B1 | | 4/2001 | Phan et al. | |
| 6,256,093 B1 | | 7/2001 | Ravid et al. | |
| 6,473,851 B1 | * | 10/2002 | Plutowski | 713/1 |
| 6,483,938 B1 | | 11/2002 | Hennessey et al. | |
| 6,598,210 B1 | * | 7/2003 | Miwa | 716/4 |
| 6,661,515 B1 | | 12/2003 | Worster et al. | |

OTHER PUBLICATIONS

International Search Report, PCT/US05/35357, mailed Jan. 24, 2006.

* cited by examiner

*Primary Examiner*—John Barlow
*Assistant Examiner*—Cindy D. Khuu
(74) *Attorney, Agent, or Firm*—Baker & McKenzie LLP

(57) ABSTRACT

Hybrid methods for classifying defects in semiconductor manufacturing are provided. The methods include applying a flexible sequence of rules for defects to inspection data. The sequence of rules includes deterministic rules, statistical rules, hybrid rules, or some combination thereof. The rules included in the sequence may be selected by a user using a graphical interface. The method also includes classifying the defects based on results of applying the sequence of rules to the inspection data.

19 Claims, 5 Drawing Sheets

FLEXIBLE HYBRID DEFECT CLASSIFICATION FOR SEMICONDUCTOR MANUFACTURING

BACKGROUND OF THE INVENTION

1. Field of the Invention

The present invention generally relates to computer-implemented methods for classifying defects that occurred during the fabrication of semiconductor wafers or specimens. Certain embodiments relate to a computer-implemented method that includes flexibly applying one or more sequences of statistical rules, deterministic rules, hybrid rules, or a combination thereof for defects found by inspection of a semiconductor specimen and classifying the defects based on results of the application of the sequence of rules.

2. Description of the Related Art

The following description and examples are not admitted to be prior art by virtue of their inclusion in this section.

Wafer inspection systems often find thousands of anomalies (commonly called "events" or "defects") on each wafer. Defects may have many forms such as structural flaws, process residues, and external contamination that may occur during semiconductor wafer fabrication. Defect classification is used to make sense of the large amount of information generated by inspection and to locate the "interesting" defects. As processes for making wafers evolve, the defect types of interest change. The importance of a defect depends on several factors including appearance, and other characteristics such as location, proximity to other defects, and prior history of the specimen.

Many different defect classification methods have been used. The existing methods for classifying defects in the field of semiconductor inspection fall into three general categories: 1) deterministic rule based methods, 2) statistical/training based methods, and 3) fixed combinations of deterministic rules and trained characteristics.

Examples of fully rule-based approaches include Run Time Classification (RTC) provided on the AIT II, AIT III, and AIT XP systems, which are commercially available from KLA-Tencor, San Jose, Calif., the early release of on-the-fly (OTF) classification methods on the Compass tools commercially available from Applied Materials Inc., Santa Clara, Calif., and gray level binning for voltage contrast defects, which is commercially available from Hermes MicroVision, Milpitas, Calif. The setup of such a classifier is relatively simple and easy for the user to understand. Many of these approaches provide some user assistance by showing how the defects have been separated through a variety of graphical means and by showing examples of defects in each bin. Deterministic rule-based classifiers generally have a high throughput.

Examples of statistical (trained) classification are the current automatic defect classification (ADC) and inline ADC (iADC) products on the 23xx, AIT, eSxx, and eV300 tools commercially available from KLA-Tencor. These particular examples use a statistical classification (e.g., nearest neighbor) approach to separate defects. An additional example of a trained classifier is the current release of OTF called "OTF Grouping" commercially available from Applied Materials Inc., Santa Clara, Calif. These classification algorithms use a mathematical representation of the defects' appearance and context (sometimes called "defect features") in a "black box" fashion, matching the defects to a training set, although the user may have control of the importance of low false positive or false negative assessments for each bin.

One example of a hybrid approach is SEMVision ADC, which is commercially available from Applied Materials Inc., Santa Clara, Calif., and which has a fixed set of bins called core classes that are based mainly on defect boundary analysis, segmentation of background, and depth of defect through multi-perspective imaging. While the tree structure, which defines the order and type of decisions to be made, is fixed in this approach, the thresholding for classifying can be set by the user.

Although the above-described methods are modestly successful at defect classification, each of these methods can be improved. For example, many deterministic methods do not include all of the characteristics of the defects that are relevant to good classification. In addition, fixed boundaries often do not work well over time on different specimens. The deterministic rule based methods are also generally inflexible in the usage of rules and defect characteristics. In addition, these methods generally include some restrictions on the number and kinds of characteristics and how they are combined. Furthermore, these methods generally have user interface deficiencies in being able to create the classification recipe. For example, the user interface can be complex to navigate, and the final results may not be clear.

One disadvantage of the fully trained approaches is that these methods generally rely on having a sufficient population of the defects for each bin available for training. These methods also need to be maintained and updated as defects that look different are found or as processing conditions change. In addition, these methods work in a way that may not reflect the intentions of the user because these methods function as a black box (i.e., the user is unable to select the characteristics or characteristic groups to be used to do the classification). Furthermore, these methods often neglect non-appearance characteristics that can be important in separating defects for purposes of analysis. Lastly, fully trained classifiers are generally slower to execute than deterministic rules, particularly ones trained with a large number of characteristics.

The inflexible, hybrid methods have disadvantages such as that these methods often do not account for novel ways that the user might want to separate defects for a particular image or specimen. In addition, these methods rigidly restrict the paths used to bin the defects.

Accordingly, it may be advantageous to develop computer-implemented methods for classifying defects that eliminate one or more of the disadvantages described above.

SUMMARY OF THE INVENTION

An embodiment of the invention relates to a flexible computer-implemented method for classifying defects found in semiconductor manufacturing. The term "flexible" as used herein can be generally defined as user configurable or user defined. In other words, a "flexible computer-implemented method" may be defined as a computer-implemented method in which parameters may be defined and/or configured by a user. The manner in which computer-implemented methods described herein are flexible and the benefits of this flexibility will be apparent upon further reading of the description of the invention provided herein.

The method includes applying a sequence of rules for defects to inspection data generated by inspection of a semiconductor specimen. The sequence of rules include statistical rules, deterministic rules, hybrid statistical and deterministic rules, or some combination thereof.

The deterministic rules apply one or more tests to characteristics of the defects, herein also called "attributes." For example, the attributes or characteristics may include whether the defects are dark or bright, contrast of the defects with respect to background, measured size, detection method (e.g., how the defect was detected), information about defects on other levels of the specimen, location of the defects on the specimen, proximity to other events, or some combination of attributes that are used deterministically to bin defects.

In contrast, the statistical rules may be based on characteristics of the defects including color, size, edge sharpness, eccentricity, roundness, transparency, texture, or some combination thereof. The statistical rules apply the characteristics statistically to bin defects. The characteristics of the defects input to the statistical rules and the deterministic rules used for the application of the sequence of the rules may be selected by a user. A hybrid rule may use both measurable characteristic (e.g., measured size) and statistical characteristic (e.g., statistical size) information together for classification.

The statistical rules, the deterministic rules, and the hybrid rules may be user defined. In one embodiment, the statistical rules, the deterministic rules, and/or the hybrid rules used for application to the inspection data are selected by a user to create a sequence or "recipe" for performing classification. In another embodiment, the deterministic, statistical, and/or hybrid rules are applied during the inspection. In an additional embodiment, applying the sequence of rules may be performed after a testing operation, after complete wafer inspection, or after the inspection of several wafers.

In another embodiment, a portion of the sequence of rules is applied as the defects are found during inspection. Another portion of the sequence of rules is applied at the end of the inspection. This other portion of the sequence of rules may include rules based on proximity of the defects to other defects on the specimen or previous specimen history. Dependent rules may be applied after the other portion is applied. For example, some of the deterministic and statistical rules may be applied during the inspection, while other deterministic rules, such as the proximity of other defects (as in a scratch) or the fact that a defect type repeats across a wafer, would be applied at the end of the inspection. In this manner, rules that depend upon results or information that is not available until the end of inspection will be executed at that time. In an additional embodiment, applying the sequence of rules to the inspection data may be performed while a user is reviewing the defects (e.g., on the same tool or a different tool).

The method also includes classifying the defects based on results of the application of the sequence of rules. In one embodiment, the classification may result in defects being put in the same bin through a variety of rules. In one embodiment, results of classification may include multiple output classifications for the defects. In addition, the method may include determining if the defects are nuisance defects based on results of the application of the deterministic rules or a combination of deterministic and statistical rules. In another embodiment, classifying the defects may include filtering the defects (e.g., removing data representative of these defects) that are determined to be nuisance defects based on the results of applying the statistical and/or deterministic rules to the inspection data.

In one embodiment, the method may include tuning inspection recipes based on results of the classification. In another embodiment, the method may include performing engineering analysis using results of the classification. In an additional embodiment, the method may include using results of the classification in sampling defects for a subsequent activity. For example, the method may include using the bins as an input into other analytical algorithms such as a sampling algorithm for manual or automatic review. In another embodiment, the results of the classification could be used to assist a user during manual classification of defects based on data from the inspection itself or from a different review tool, such as a review scanning electron microscope (SEM). In another embodiment, the method may include performing the computer-implemented method for inspection data generated by different inspection tools having different hardware configurations.

In one embodiment, the deterministic rules, the statistical rules, and the hybrid rules used for applying the sequence of rules to the inspection data are selected by a user. In another embodiment, the sequence of rules may be organized by a user working with an interactive user interface. In an additional embodiment, the method may include building a deterministic rule using the interactive user interface through applying unrestricted Boolean operators to defect attributes.

The sequence of rules may be represented in the interactive user interface as a tree having different levels. In one embodiment, the tree may include nodes that produce one or more branches, one or more terminating bins, or some combination thereof. In some embodiments, the tree may include deterministic nodes, statistical nodes, hybrid deterministic and statistical nodes, or some combination thereof. In another embodiment, the tree may include deterministic nodes designated by attribute name, statistical nodes designated by name, hybrid nodes designated by name, or some combination thereof.

In one embodiment, the sequence of rules may include only statistical rules. In one such embodiment, these rules may be organized into groups to aid in user understanding of the rules and to allow selectivity in the characteristics to be used. This selectivity has three major advantages: classification can be done with significantly fewer examples, which may include abstract examples; classification can be stable over more specimens; and classification can be executed more quickly. In another embodiment, the statistical rules may be weighted separately. In an additional embodiment, the statistical rules and the hybrid rules may be organized into groups for selection to aid in user understanding of these rules and to provide classifications that reflect the intent of the user.

The interactive user interface described above may illustrate results of classification graphically and with sample images. Each of the embodiments of the computer-implemented method described above may include any other step(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
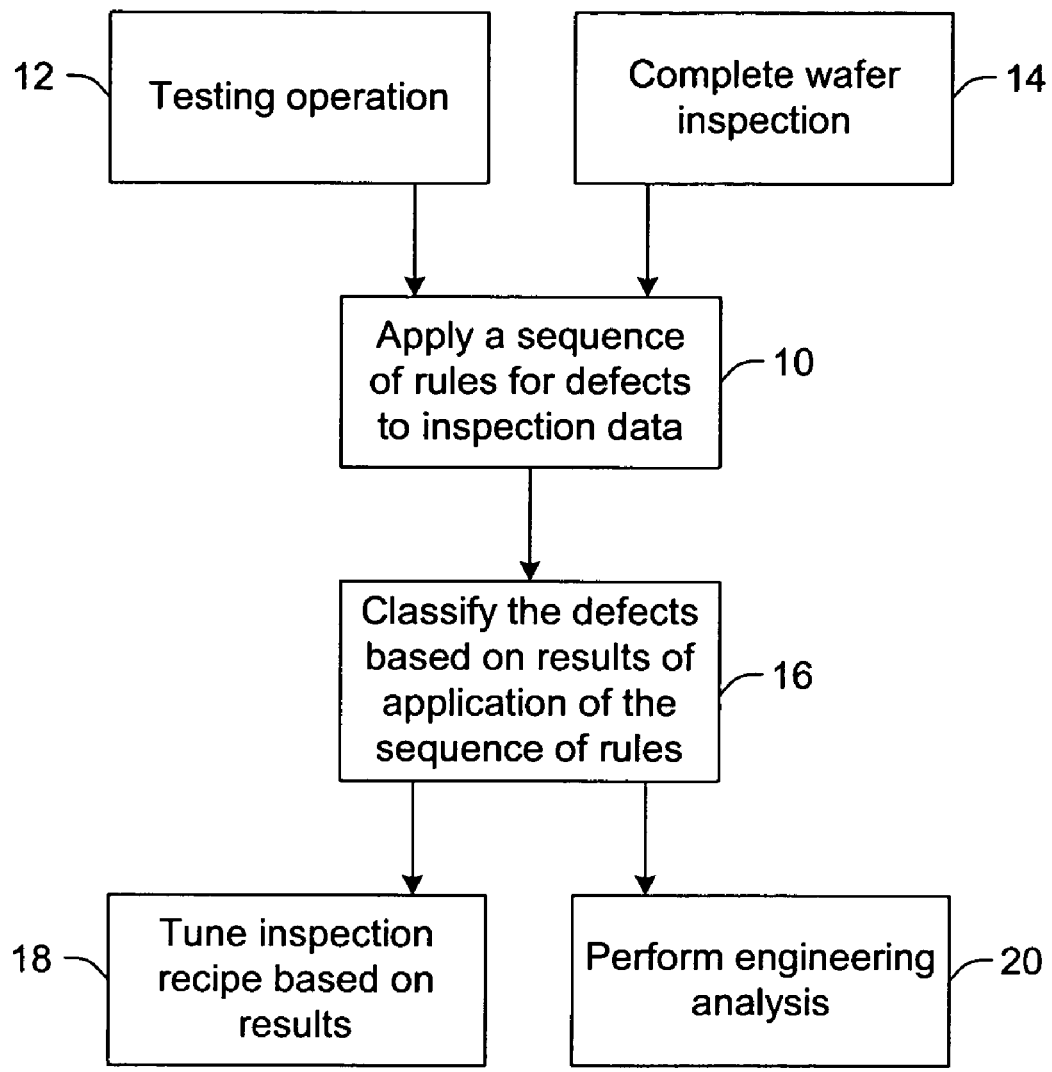
FIG. 1 is a flow chart illustrating one embodiment of a flexible computer-implemented method for classifying defects.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "defects" refers to any anomalies that may be found on a semiconductor specimen. As used herein, the term "semiconductor specimen" is used to refer to a wafer or any other specimen known in the art such as a reticle or photomask. Although embodiments are described herein with respect to a wafer, it is to be understood that the embodiments may be used to classify defects detected on any other specimen known in the art of semiconductor manufacturing.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include only the substrate such as an upatterned virgin wafer. Alternatively, a wafer may include one or more layers formed upon a substrate. For example, such layers may include, but are not limited to, a resist, a dielectric material, and a conductive material. A resist may include any material that may be patterned by an optical lithography technique, an e-beam lithography technique, or an X-ray lithography technique. Examples of a dielectric material may include, but are not limited to, silicon dioxide, silicon nitride, silicon oxynitride, and titanium nitride. Additional examples of a dielectric material include "low-k" dielectric materials such as Black Diamond™ which is commercially available from Applied Materials, Inc., Santa Clara, Calif., and CORAL™ commercially available from Novellus Systems, Inc., San Jose, Calif., "ultra-low k" dielectric materials such as "xerogels," and "high-k" dielectric materials such as tantalum pentoxide. In addition, examples of a conductive material include, but are not limited to, aluminum, polysilicon, and copper.

One or more layers formed on a wafer may be patterned or unpatterned. For example, a wafer may include a plurality of dies, each having repeatable pattern features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "integrated circuit." In addition, other devices such as microelectromechanical (MEMS) devices and the like may also be formed on a wafer.

A flexible user interface combining trained and deterministic rules is known as Rule Based Binning (RBB), which will be commercially available from KLA-Tencor on the 23xx Release 10.1, eS3x Version 1.3, and 9xxx Version 9.0. RBB is a deterministic rule based approach that allows the results of iADC (trained approach) to be used as an input to the deterministic rules. The capabilities of RBB are included and extended in this application.

Turning now to the drawings, FIG. 1 illustrates one embodiment of a flexible computer-implemented method for classifying defects. It is noted that the steps shown in FIG. 1 are not essential to practice of the method. One or more steps may be omitted or added to the method illustrated in FIG. 1, and the method can still be practiced within the scope of this embodiment.

The method includes applying a sequence of rules for defects to inspection data, as shown in step 10. The inspection data is generated by inspection of a semiconductor specimen. The sequence of rules includes statistical rules, deterministic rules, hybrid statistical and deterministic rules, or some combination thereof. In one embodiment, applying the sequence of rules may include applying the statistical rules and using the results of application of the statistical rules as input to the deterministic rules or vice versa.

In some embodiments, the statistical rules, the deterministic rules, and/or the hybrid rules that are applied to the inspection data may be user defined. In other words, the statistical, deterministic, and hybrid rules may be essentially written and/or edited by the user. Alternatively, the statistical rules, the deterministic rules, and/or the hybrid rules may be generated by the computer-implemented method. The computer-implemented method may include generating the statistical, deterministic, and/or hybrid rules based on, for example, defect images selected by a user. In addition, the computer-generated rules may be edited by a user. The statistical rules, the deterministic rules, and the hybrid rules may have any form known in the art.

The deterministic rules are based on one or more measurable characteristics of the defects. In some embodiments, these characteristics may include attributes such as whether the defect is dark or bright, how the defect was detected or detection method (e.g., the level of tolerance in the threshold used to detect defects), contrast of the defects with respect to background, measured size, information about defects on other levels of the specimen, location of the defects on the specimen, proximity to other events, other attributes depending on the capabilities of the inspection tool, or some combination of attributes that are used deterministically to classify defects. The deterministic rules apply one or more tests to the characteristics of the defects. For example, the deterministic rules use one or more of these measurable properties of the defects in a deterministic manner to separate the defects for further processing and/or to assign them to bins.

One example of a deterministic rule is that if light is scattered from a defect at particular collection angles (e.g., at substantially opposite collection angles, but not at other collection angles), then the defect is a scratch. The collection angles at which the light is scattered from the scratch may also indicate the direction of the scratch (e.g., the direction in which the scratch extends lengthwise). Another example of a deterministic rule would be that defects that are located in areas with geometry that is unimportant or redundant may be binned as nuisance defects. The deterministic rules that are included in the sequence of rules and are applied to the inspection data may vary depending on, for example, the defects of interest, the defects that are expected to be formed on the specimen, the specimen characteristics, the process history of the specimen, and the like. The rules may also vary depending on one or more characteristics of the inspection tool that is used to generate the inspection data (e.g., inspection tool type such as e-beam or optical, inspection tool configuration such as wavelength, optical configuration, etc.).

The statistical rules are based on characteristics of the defects such as color, size, edge sharpness, eccentricity, roundness, transparency, texture ("roughness"), context, or some combination thereof. Obviously, the statistical rules that are applied to the inspection data may vary depending on, for example, defects of interest, defects expected on the specimen, characteristics of the defects of interest or the expected defects, characteristics of the specimen, and process history of the specimen. In addition, the statistical rules may vary depending on the type of inspection tool that is used to generate the inspection data and other characteristics of the inspection tool such as wavelength, optical configurations, etc. The statistical rules apply the characteristics statistically to bin defects.

The size of the defect may include various dimensional characteristics such as height, width, length, aspect ratio, area, and the like. Some of these characteristics can be used directly as attributes, or they may be put through a statistical rule to find defects that are similar in size to members of a training set or an abstract concept of size. The characteristics of the defects input to the statistical rules (and the deterministic rules) used for application to the defect information may be selected by a user as described further herein.

The characteristics used by the statistical rules may be organized into groups to aid in user understanding of the statistical rules. For example, the statistical characteristics may be organized in sensible groups such as size and context to match human understanding. Underlying each of the rules may, or may not, be training sets that can be adjusted, but do not need to be trained for every sample set. Therefore, the user is able to classify defects using groups of characteristics that the user selected thereby providing more control to the user than existing trained classifiers without encumbering the user with fine details.

The statistical rules may be based on any statistical parameters known in the art. Examples of statistical rules include a nearest neighbor type rule and a neural net type rule. Statistical rules may be used, for example, to describe very complex situations. In one such example, a statistical rule may be used to classify background data into different types such as open, sparse, and dense. These complex situations are difficult to envision and develop into deterministic rules. The statistical rules can be used to develop new attributes that can be used to generate a new rule. The statistical rules may use one or more characteristics of the defects as input or parameters. Such characteristics may be used as a single group or in any combination. Fewer samples are needed for a restricted sequence of characteristics than for large set of characteristics. In addition, one or more of the deterministic rules or one or more of the statistical rules may be modified to account for other levels on the specimen.

Typically, statistical rules are generated using training data. The training data may include inspection data generated for a number of specimens, which is analyzed statistically by the computer-implemented method. The statistical analysis may then be associated with various parameters of the specimen such as open, sparse, and dense backgrounds. The associations may be assigned by a user. Alternatively, the associations may be generated by the computer-implemented method.

Each of the rules may include parameters for a number of different characteristics. Any combination of such characteristics may be used, and groups of individual characteristics may be weighted separately. For example, each of the statistical characteristics may be weighted separately in each rule. The exact characteristics that are available for each rule are only restricted by the nature of the inspection or review tool.

As shown in FIG. 1, the method also includes classifying the defects based on results of the application of the sequence of rules, as shown in step 16. In particular, the defects may be classified based on the results of the deterministic rules, the statistical rules, the hybrid rules, or the combination thereof that are applied to the inspection data. Results of the classification may include multiple output classifications for the defects. In another example, the output of the classification operation may feed into other automatic operations, such as determining a sample plan for automatic or manual review of the defects. In other words, the results of classification may be used in sampling defects for a subsequent activity.

In one embodiment, classifying the defects may include determining if the defects are nuisance defects based on the results of the application of the deterministic rules or a combination of deterministic and statistical rules to the inspection data. For example, nuisance defects may be identified using one or more deterministic rules that are based on information about another level on the specimen or the process used to form the specimen. In one such example, the location of a defect in a die on a wafer may be compared to locations of nuisance or permissible defects in the die, and if the location coincides, then the defect may be identified as a nuisance defect. This comparison may be performed based on various data sources, such as design data or user input. Any other method may be used to detect nuisance defects in inspection data. For example, if defects do not fall into at least one of the bins, then the defects may be identified as nuisance defects. In other words, the deterministic and statistical rules may be created and selected to identify only those defects which are of interest. Defects that are identified as nuisance defects can be filtered (e.g., removed) from the inspection data.

The methods described herein provide flexible, rule-based approaches to classifying defects. One advantage of the methods described herein is that the methods provide significant flexibility and selectivity in the rules that are applied to the inspection data. For example, the statistical rules, the deterministic rules, and the hybrid rules that are used for application to the inspection data may be defined by a user. The user may write the rules or may edit existing rules or rules that are computer generated. For example, these flexible recipes may be stored in files as extensible markup language (XML) documents or other usable formats as simple recipes or collections of rule based recipes, and the recipes can be created and edited through off-line or online user interfaces.

In addition, the sequence of rules that is applied to the inspection data may be selected by a user. For example, the flexible recipes can be reused and recombined as templates. In particular, the methods can be implemented with a flexible user interface (UI) that provides an extendable number of attributes and relationships. The methods described herein allow the user to evaluate defect attributes and combine results using Boolean or arithmetic operators. New attributes can be added to the sequence of rules by editing a configuration rather than having to re-implement the software. In another example, the user may select the rules from a rules database or library that contains all of the existing rules that are available for application to inspection data. Alternatively, the database or library may present only a subset of the rules that are available for application to the inspection data (e.g., based on the type of specimen that was inspected or the history of the specimen). The user may then create a sequence of rules that is to be applied to the inspection data by selecting one or more rules from those presented. The user may also create the sequence of rules using the UI that is described in detail below.

The methods are also flexible in the manner in which they may be performed. For example, the architecture used to implement the methods described herein may be configured to allow the sequence of rules to be invoked at any time that inspection data is available. In this manner, the sequence of rules may be applied to inspection data after testing operation 12 has been performed on a specimen. The term "testing operation" as used herein is intended to refer to one of the processes that may be performed on a specimen by an inspection tool during inspection or a review tool in the process of performing an automated review. In addition, or alternatively, the sequence of rules may be applied to the inspection data after complete wafer inspection or review 14. Advantageously, the sequence of rules applied after each testing operation and complete wafer inspection or review may be selected based on their sensitivity to the type of data generated and the types of defects being detected.

In another example, a portion of the sequence of the rules may be applied as the defects are found during inspection. Another portion of the sequence of rules may be applied at the end of the inspection. This other portion of the sequence of rules may include rules based on proximity of the defects to other defects on the specimen or previous specimen history. Dependent rules may also be applied after this other portion of the sequence of rules is applied.

In another example, the methods are also flexible with respect to when the sequence of rules is applied to the inspection data. For example, a sequence of rules may be applied to the inspection data after one testing operation while another testing operation is being performed on the specimen. Therefore, the sequence of rules may be applied to inspection data while the inspection is still being performed. Additionally, the sequence of rules may be applied to the inspection data while a user is reviewing the defects. In this manner, the methods described herein may improve the throughput of the overall defect classification process.

In a further example of the flexibility of the methods described herein, different sequences of rules may be applied to the inspection data. In addition, the results of the application of one sequence of rules may be used to determine if another sequence of rules should be applied to the inspection data, and if so, then which sequence of rules will be applied. The different sequences of rules that are applied may also be selected by a user. Each of the different sequences of rules may be configured as described above. In particular, each of the different sequences of rules includes one or more statistical rules, one or more deterministic rules, one or more hybrid rules, or some combination thereof. In addition, the different sequences of rules may be generated in different manners (e.g., one sequence user defined, another sequence computer generated) or in the same manner.

In addition, the user can be selective in the aspects or characteristics of the defects that are to be used in the statistical, deterministic, and/or hybrid rules based on known areas of interest. For example, if the user is primarily interested in defects because of the appearance of the background (its density or geometry) rather than the appearance of the defect itself, rules can be selected that focus on context. Alternatively, if size is more important than shape to the user, size characteristics can be weighted more heavily than shape.

Furthermore, the methods described herein can be performed for inspection data generated by different inspection or review tools having different hardware configurations. For example, as described above, the deterministic rules, the statistical rules, and the hybrid rules that are applied to inspection data may vary depending on the configuration of the inspection tool that was used to generate the inspection data. In addition, the deterministic rules, the statistical rules, and the hybrid rules that are applied may be varied relatively easily and quickly as described herein. For example, a user is able to combine a configurable set of characteristics together using Boolean expressions without a limitation on the number of attributes or the types of attributes. This flexibility makes it possible to use the same software on multiple tools with different hardware. Therefore, the same method may be applicable to many different semiconductor specimens and many different inspection tools. In addition, these recipes may be stored in files as extensible markup language (XML) documents or other readable formats, which can be "ported" across different inspection tools.

Moreover, the methods described herein are flexible and advantageous in that they can be implemented using any software constructs known in the art with any interface known in the art. For example, the methods described herein may be configured as plug-ins for various other defect analysis engines. The UI can be implemented using any tool package known in the art and can be run on any operating system known in the art.

The method shown in FIG. 1 may also include a number of additional steps. For example, in one embodiment, the method may include tuning one or more inspection recipes based on the results of classification, as shown in step 18. Tuning the inspection recipes may be performed by looking at defects in different combinations of categories. In some embodiments, tuning the inspection recipe(s) may include altering one or more parameters of the inspection recipe(s) such that the inspection recipe(s) are more sensitive to one or more selected types of defects. The one or more parameters of the inspection recipe(s) that may be altered may include, for example, the type of inspection tool, the wavelength of illumination, the angle of incidence, the angle of collection, the polarization of light, sampling rate, etc. In another embodiment, tuning the inspection recipe(s) may include altering one or more parameters of the inspection recipe(s) such that the inspection recipe(s) are less sensitive to nuisance defects. In a further embodiment, tuning the inspection recipe(s) may include tuning an inspection recipe that will be used to re-inspect the specimen. Re-inspection may be performed after classification of the defects or after another process such as a repair or cleaning process has been performed on the specimen. In another embodiment, instead of tuning an existing recipe, the method may include creating a new inspection recipe based on the results of the classification as described above.

In another embodiment, the method may include performing engineering analysis using the results of classifying the defects, as shown in step 20. The engineering analysis may include using the defect data generated by the classification methods described herein and optionally running different classification recipes. The engineering analysis may also include, for example, determining if one or more of the processes used to fabricate the specimen are outside of the established tolerances. In another example, the engineering analysis may include monitoring one or more of the processes used to fabricate the specimen. In addition, the engineering analysis may include determining if one or more parameters of one or more processes used to fabricate the specimen should be altered and determining the new parameters or correction factors if corrections are desired. In this manner, the engineering analysis may include statistical process control, feedback control, and any other type of control known in the art. For example, the engineering analysis may include feedforward control for determining one or more processes to be performed on the specimen and/or one or more parameters for one or more processes to be performed on the specimen. In one such example, the engineering analysis may include determining if a cleaning or other repair process should be performed on the specimen.

In another example, the method may include analyzing the defects that have been binned. Analyzing the defects may include determining the locations of defects in a bin, mapping the locations of defects in a bin, or performing any other functions on the inspection data corresponding to the defects in a bin. In an additional example, the method may include analyzing the actual defects on the wafer using one or more additional inspection and/or review processes or tools such as energy dispersive X-ray spectroscopy ("EDS") devices, which can be used to determine the composition of a defect. In a further example, the method may include sorting defects within a bin. The defects within a bin may be sorted using one or more characteristics of the defects such as location and/or size.

The deterministic rules, the statistical rules, the hybrid rules, or some combination thereof that are applied to the inspection data may be selected by a user as described above. For example, the sequence of rules that is applied to the inspection data may be selected and organized by a user working with an interactive UI. In particular, the user may construct a flexible classifier by working with an interactive UI that represents the separation of defects as a tree that can have many different levels. However, the separation of the defects may be represented in the interactive UI using any other method, graphic, or structure known in the art.

Figure 2:
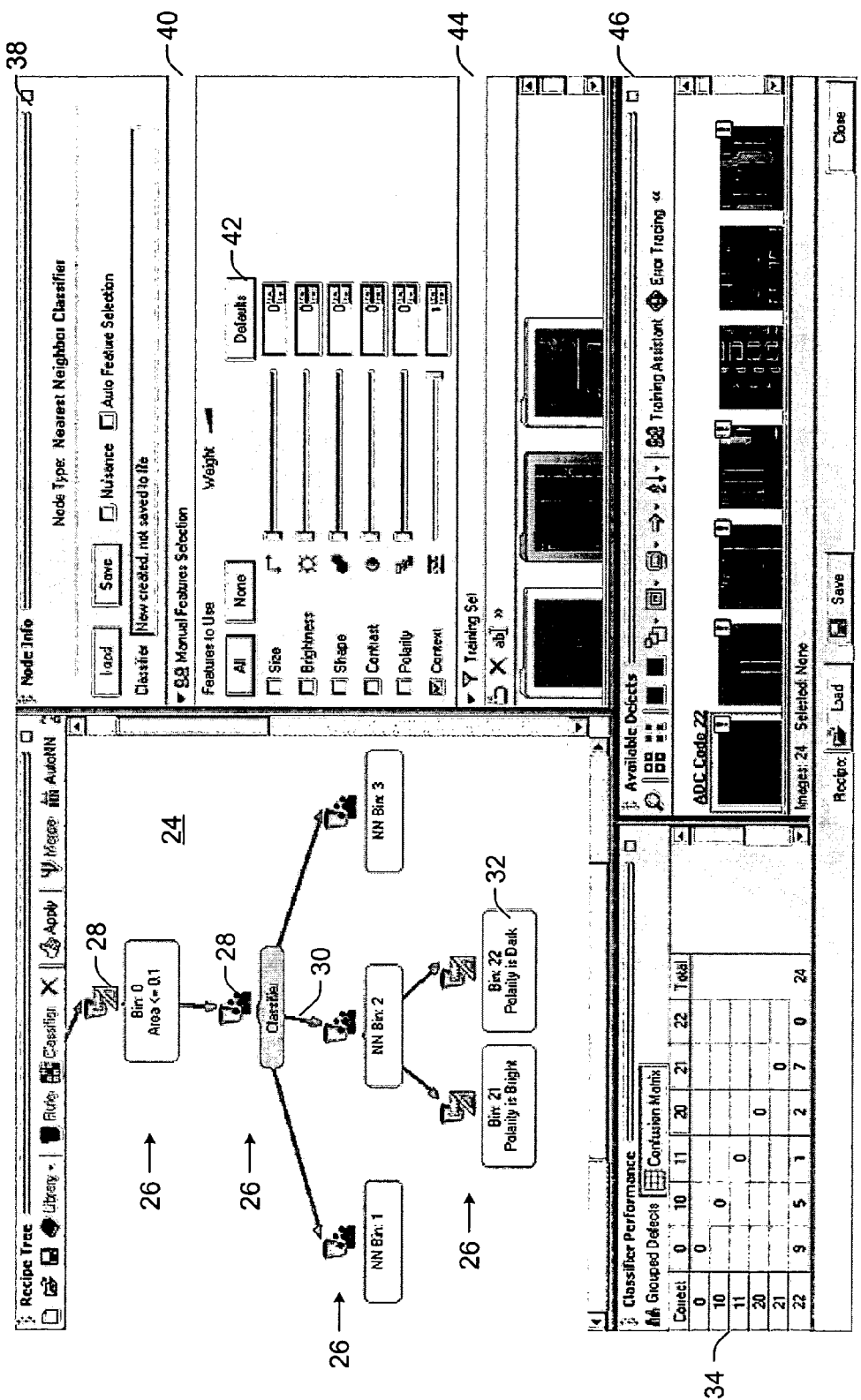
FIGS. 2 and 3 are prototype screenshots illustrating one example of a user interface that can be used to perform one or more of the computer-implemented methods described herein for classifying defects.

One example of such a UI is illustrated in FIG. 2. The sequence of rules is represented in the interactive UI as tree 24 having different levels 26. Although four levels of the tree are illustrated in the interactive UI shown in FIG. 2, it is to be understood that more levels of the tree can be illustrated by scrolling up and down. In addition, although four levels of the tree are illustrated in the interactive UI shown in FIG. 2, it is to be understood that the tree may include any suitable number of levels, and the flexibility with which the tree may be generated and edited advantageously provides significant advantages in the different types and configurations of trees that may be generated.

Users can construct the rule/decision tree by working with the basic elements as nodes, which can be constructed as deterministic or statistical nodes, or users can combine the elements into more complex nodes that combine statistical classifiers with attributes (i.e., hybrid nodes). As further shown in FIG. 2, tree 24 includes nodes 28 that produce one or more branches 30, one or more terminating bins 32, or some combination thereof. Any node in the tree, regardless of type, can produce one or more branches and/or one or more terminating bins. As such, the output of statistical classifiers is the same as deterministic node outputs. In other words, both types of nodes function as rules.

Each node in the tree represents a rule that is included in a sequence. In this manner, the tree may include deterministic nodes, statistical nodes, hybrid deterministic and statistical nodes, or some combination thereof. In the tree, the deterministic nodes may be designated by attribute name (e.g., the attribute being evaluated and the rule being applied), and statistical and other complex nodes (e.g., hybrid nodes) may be designated by name. Such a graphical representation assists in seeing and comprehending the outcome of choices made by the user. Each of the nodes, simple or complex, may be saved as a sub-recipe and reused in other classifiers.

The interactive UI may illustrate results of classifying graphically and with sample images. For example, as shown in classifier performance box 34, the UI may illustrate the number of defects that are grouped in one node. Although the classifier performance is illustrated in a confusion diagram, it is to be understood that any suitable graphic or method may be used to illustrate the classifier performance. The node for which the performance is illustrated may be selected by selecting a node in tree 24 such as the classifier node that is highlighted in tree 24. In addition, sample images of defects may be illustrated by selecting a "show defects" option (not shown) in the classifier performance box. The sample images may include the raw inspection data. Other types of defect data may be illustrated in a similar manner. The results of the classifying may be available graphically and through example images as the user constructs the tree for a sample population. Therefore, the UI provides feedback to the user during the setup of the classifier.

The interactive UI may also illustrate other information about the selected node. For example, the UI may display general information about the node in node info box 38. In one example, the node type may be listed in the node info box. In addition, classifier information may be listed in the node info box. Furthermore, any changes that are made to the selected node using the UI may be saved by selecting the save button in the node info box. In addition, the existing node in the tree may be replaced by selecting the load button in the node info box. Selecting the load button in the node info box may result in the presentation of a number of nodes that are available to the user for insertion into the tree.

The node info box also illustrates the characteristics of the node that were manually selected for the node. For example, in manual characteristics selection portion 40 of node info box 38, the characteristics that are available for a node are illustrated. In addition, the manual characteristics selection portion illustrates both those characteristics that were selected as well as characteristics that were not selected. In particular, for the selected node, the selected characteristics are a subset of the available characteristics for this particular type of inspection equipment.

Although a number of particular characteristics are illustrated in the UI of FIG. 2, it is to be understood that any number of characteristics may be available and selected for each node depending on the equipment, and the characteristics that are available for each node may include any appropriate characteristics known in the art. As further shown in the manual characteristics selection portion, each characteristic can be manually weighted individually, and the weighting is shown both graphically and numerically. In addition, the user can select default button 42 to set the individual weights assigned to the characteristics to their default values.

The node info box also provides information about the training set that was used to generate the node. Training set portion 44 may only be illustrated for those nodes (e.g., statistical nodes) that were generated using a training set.

The contents of the training set may be illustrated by selecting the file shown in the training set portion. In addition, the UI may be configured such that the training set may be edited once the training set has been opened by selecting this file. The training set may be edited manually. Alternatively, the training set may be altered automatically by the computer-implemented method, and such alterations may not be illustrated in the UI until they are finished.

The UI shown in FIG. 2 may also include available defects box 46. The available defects box may illustrate the verification defects. For example, the available defects box may illustrate the defects as they were classified by another classification method such as ADC. Therefore, the results of different methods may be compared, and the individual classification functions may be edited accordingly. As shown in FIG. 2, the available defects box may illustrate images of the defects. Alternatively, the available defects box may provide information about the verification defects using any suitable method known in the art.

Although the UI is shown in FIG. 2 to include four different boxes containing information about a tree and a selected node of the tree, it is to be understood that the UI may include fewer than four information boxes or more than four information boxes. In general, the amount and organization of the information shown in the UI may be designed to present the maximum amount of information to a user in the most manageable and easy-to-comprehend manner possible.

Figure 3:
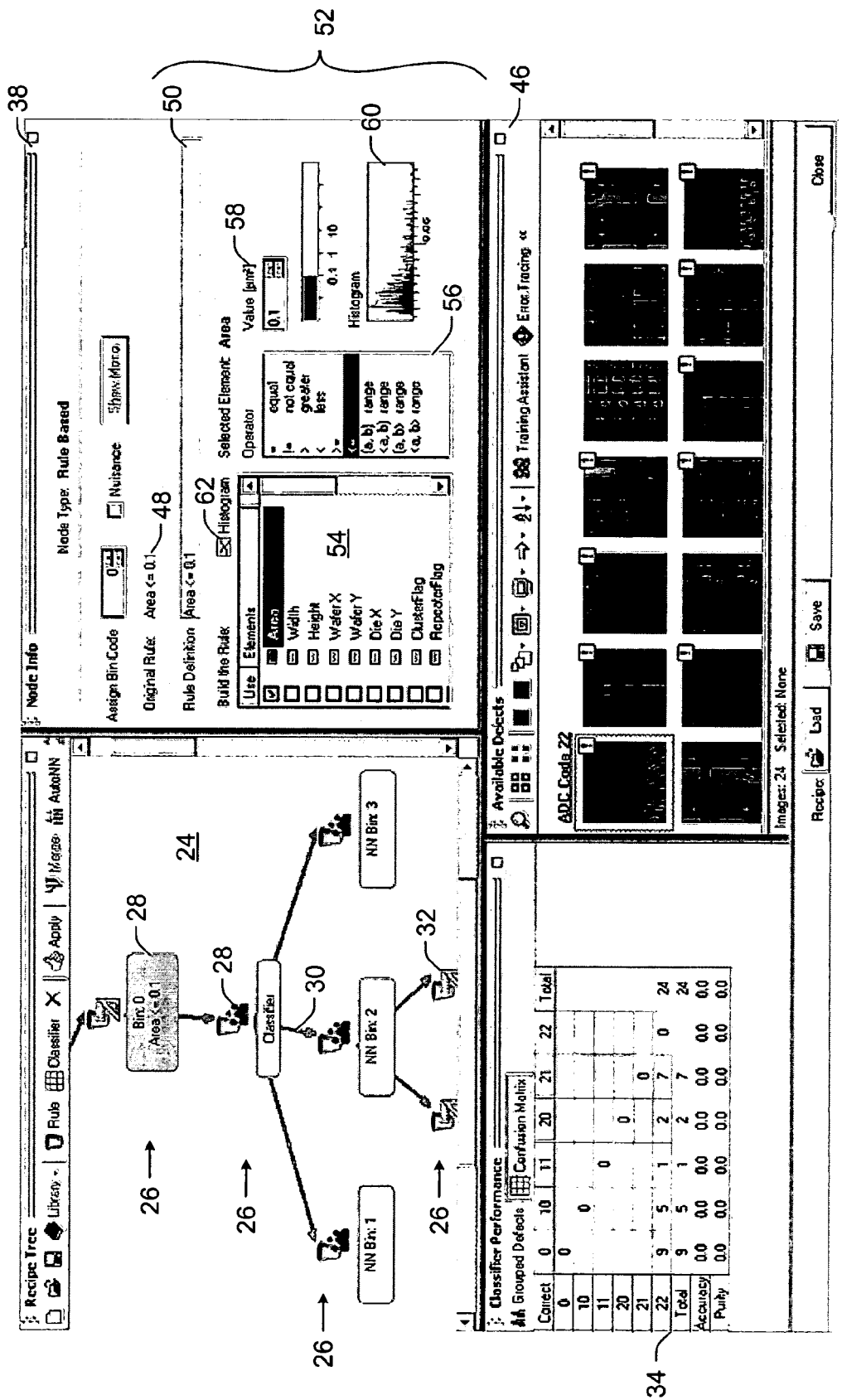

FIG. 3 illustrates another example of the user interface in which a different node is selected in tree 24. For example, in the prototype screenshot illustrated in FIG. 2, a statistical classifier node was selected while in the prototype screenshot of FIG. 3, a deterministic node is selected. In this manner, a comparison of FIGS. 2 and 3 demonstrates that the information that is displayed in the user interface will change depending on the node and the type of node that is selected. For example, like FIG. 2, FIG. 3 includes classifier performance box, which may be configured as described above. However, the classifier performance box, in this example, may include the grouping or separation of the defects by the deterministic node that is selected, instead of the classifier node that was previously selected.

In addition, FIG. 3 includes node info box 38. However, like the classifier performance box, the information that is displayed in the node info box has changed to reflect the selected node. For example, because a deterministic node was selected in tree 24, the node info box displays description 48 of the original rule and description 50 of the rule definition. Although the original rule and rule definition descriptions are the same in FIG. 3, it is to be understood that these descriptions may be different.

Node info box 38 also includes build the rule portion 52, which provides list 54 of a number of different attributes that can be selected or de-selected by a user. In addition, the build the rule portion includes list 56 of possible operators that may be combined with the selected attribute(s). In this manner, the method may include building one or more of the deterministic rules included in a sequence using the UI to apply unrestricted Boolean operators to defect attributes. The list of possible operators may be altered depending on which attribute(s) are selected by the user.

The build the rule portion further includes input box 58 in which a user can enter a value to be used with the selected operator. The user can enter the value by clicking arrows next to the input value box until the desired value is displayed, or the user can type the value in the input value box. The build the rule portion may also display histogram 60 to the user if histogram option 62 is checked. The histogram may illustrate the number of defects that have various values of the selected attribute(s). In this manner, the build the rule box may provide information about the defects to the user such that the user can use this information to build a rule that will be useful for the defects on the specimen.

As shown in FIG. 3, this user interface does not include a training set box like training set box 44 shown in FIG. 2. A training set box is not illustrated in the user interface of FIG. 3 since the selected node is a deterministic node. A training set will not be available for a deterministic node.

As further shown in FIG. 3, the user interface includes available defects box 46, which as described above may illustrate verification defects. The verification defect information illustrated in this box may include the information described above. In addition, the verification defect information may provide useful information to the user while building a rule. The available defects box may be further configured as described above. The user interface of FIG. 3 may be further configured as described above and will have the same advantages as the user interface of FIG. 2.

Figure 4:
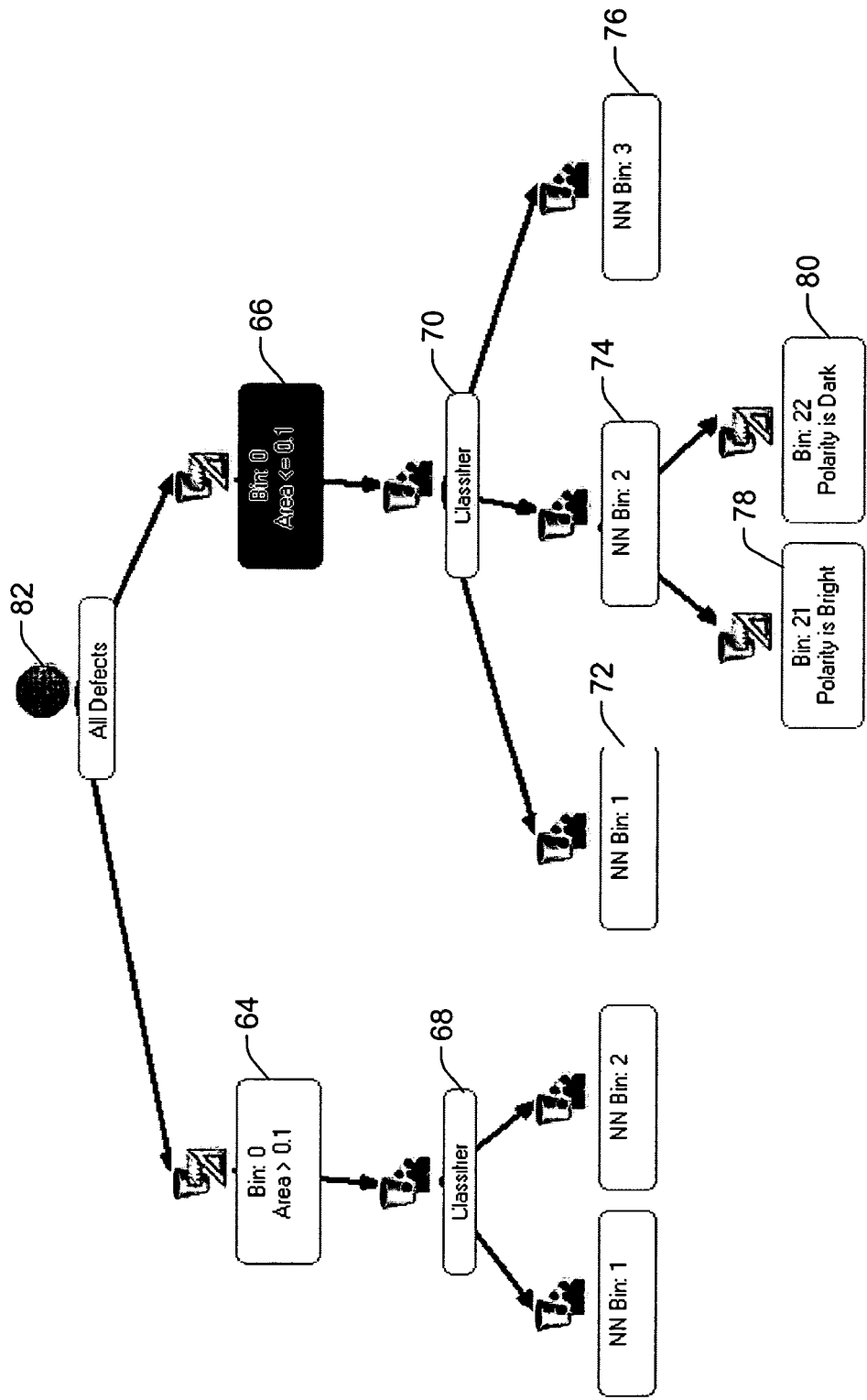
FIG. 4 is a detailed example of a user interface that demonstrates a hybrid classification tree.

FIG. 4 is a more detailed view of an example of a hybrid tree. This example illustrates the concept that deterministic nodes 64 and 66 can branch to statistical nodes 68 and 70, respectively. In addition, statistical nodes can branch to deterministic nodes. For example, the deterministic rule nodes for defect area can branch to statistical rule nodes, and some of these statistical rule nodes can branch to deterministic rule nodes based on whether the defect is bright or dark. In one such example illustrated in FIG. 4, deterministic node 66 branches to statistical node 70, and statistical node 70 branches to three different statistical nodes 72, 74, and 76. In addition, statistical node 74 branches to deterministic nodes 78 and 80. Deterministic node 78 represents a deterministic rule based on whether a defect is bright, and deterministic node 80 represents a deterministic rule based on whether a defect is dark. The tree may be further configured as described above such that all defects 82 may be classified.

The methods described herein, therefore, increase the effectiveness of semiconductor specimen inspection and review tools by separating defects into bins or classes based on criteria that combine deterministic, statistical, and/or hybrid rules in a flexible, quick, and intuitive manner that emphasizes the user's current priorities for doing the separation. In addition, the classifier is faster and easier to set up than a trained classifier with more power than the existing rule-based approaches used in the industry. Each of the embodiments of the method described above may include any other step(s) described herein.

Program instructions implementing methods such as those described herein may be transmitted over or stored on a carrier medium. The carrier medium may be a transmission medium such as a wire, cable, or wireless transmission link, or a signal traveling along such a wire, cable, or link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Figure 5:
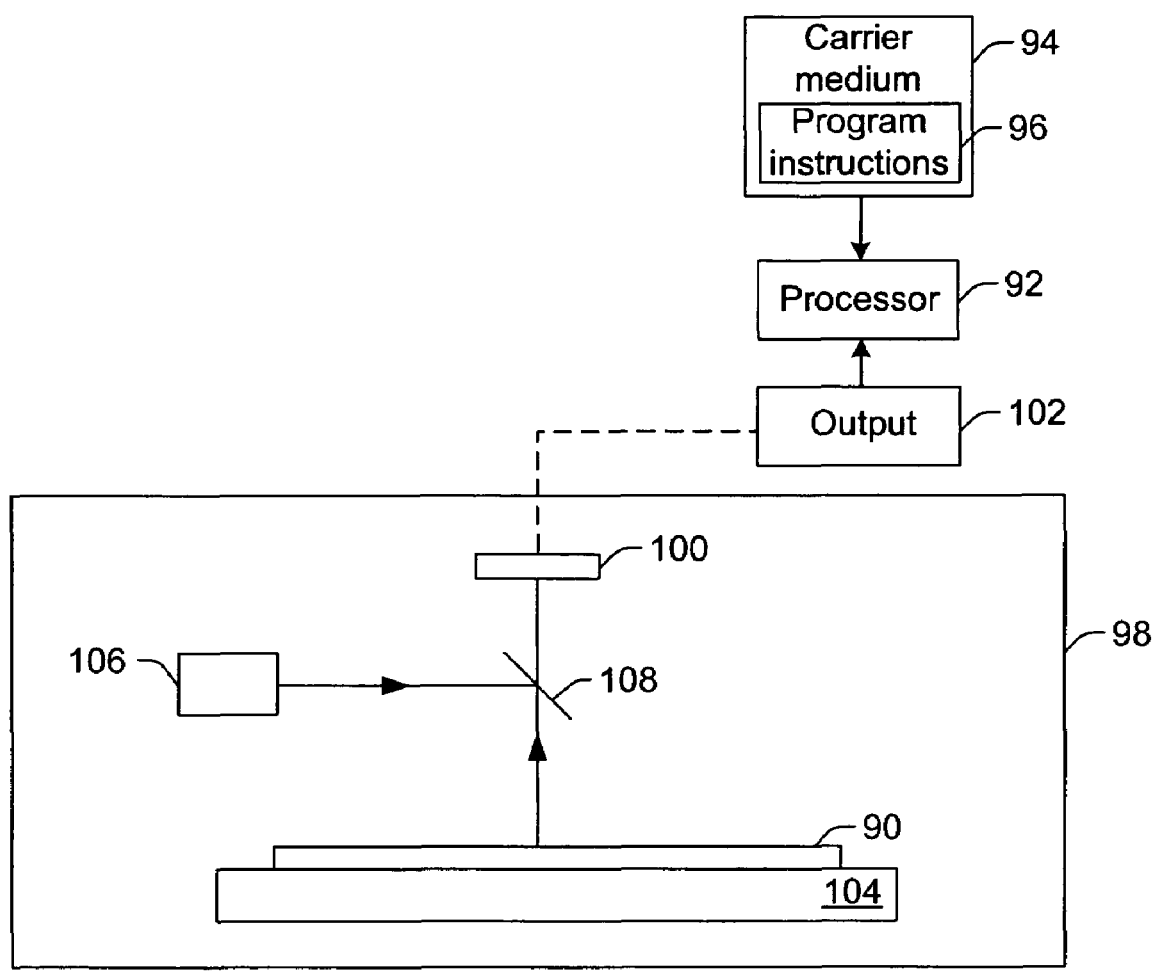
FIG. 5 is a schematic diagram illustrating a side view of one embodiment of a system that can be used to perform one or more of the computer-implemented methods described herein.

FIG. 5 illustrates one embodiment of a system configured to perform one or more of the computer-implemented methods described herein for classifying defects detected on semiconductor specimen 90. The system shown in FIG. 5 is configured to inspect a semiconductor specimen such as a wafer. However, the system may have any configuration known in the art that is suitable for inspection of any other semiconductor specimen (e.g., a reticle).

The system includes processor 92. The processor may include any suitable processor known in the art. For example, the processor may be an image computer or a parallel processor. In addition, the processor may be configured as described above. The system also includes carrier medium 94. The carrier medium may be configured as described above. For example, carrier medium 94 includes program instructions 96, which are executable on processor 92. The program instructions may be executable for performing any of the embodiments of the methods described above. The program instructions may be further configured as described above.

In some embodiments, the system may also include inspection and/or review tool 98. Tool 98 may be configured to detect defects on semiconductor specimen 90 and to generate inspection data for the semiconductor specimen that contains information about the defects on the semiconductor specimen. Tool 98 may be coupled to processor 92. For example, one or more components of tool 98 may be coupled to processor 92 by a transmission medium (not shown). The transmission medium may include "wired" and "wireless" portions. In another example, detector 100 of tool 98 may be configured to generate output 102. The output may be transmitted across a transmission medium from detector 100 to processor 92. In some embodiments, the output may also be transmitted through one or more electronic components coupled between the detector and the processor. Therefore, output 102 is transmitted from the tool to the processor, and program instructions 96 may be executable on the processor to bin defects detected on the semiconductor specimen using the inspection data included in output 102. Program instructions 96 may be further executable on the processor to perform other functions described herein (e.g., perform classification functions, sort defects within a bin, map defects within a bin, etc.). The program instructions may also be executable on the processor to detect defects on the semiconductor specimen using any method known in the art (e.g., die-to-die comparisons).

Inspection and/or review tool 98 may be configured to perform inspection of the semiconductor specimen using any technique known in the art. For example, the tool may be configured to detect light scattered by the semiconductor specimen and/or to form images of the specimen. In addition, the tool includes stage 104 upon which semiconductor specimen 90 may be disposed during measurements. The stage may include any suitable mechanical or robotic assembly known in the art. The tool also includes light source 106. Light source 106 may include any appropriate light source known in the art. In addition, the tool may include beam splitter 108, which is configured to direct light from light source 106 onto specimen 90 at angles that are approximately normal to an upper surface of specimen 90. The beam splitter may include any suitable beam splitter known in the art. The tool further includes detector 100, which is configured to detect light transmitted by beam splitter 108. The detector is also configured to generate output 102. The detector may include any of the detectors described above or any other suitable detector known in the art.

Although one general configuration of the inspection and/or review tool is shown in FIG. 5, it is to be understood that the tool may have any suitable configuration known in the art. For example, inspection and/or review tool 98 may be replaced with the measurement head of the 2360 tool, one of the AIT family of tools, the SL3UV tool, one of the Surfscan family of tools, the TeraScan or TeraStar tool, and one of the Viper family of tools, all of which are commercially available from KLA-Tencor. In addition, the inspection and/or review tool may include other optical systems such as optical imaging systems, ellipsometer-based systems, scatterometer-based systems, etc. and/or e-beam systems such as a CD SEM and the eS25 and eS30 systems, which are commercially available from KLA-Tencor.

Further modifications and alternative embodiments of various aspects of the invention may be apparent to those skilled in the art in view of this description. For example, computer-implemented methods for classifying defects are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A flexible computer-implemented method for classifying defects, comprising:
    applying a sequence of rules for defects to inspection data generated by inspection of a semiconductor specimen, wherein the sequence of rules comprises statistical rules, deterministic rules, hybrid statistical and deterministic rules, or some combination thereof, wherein a portion of the sequence of rules is applied as the defects are found at the end of the inspection;
    classifying the defects based on results of said applying, wherein results of said classifying comprise multiple output classifications for the defects; and
    illustrating the results of said classifying in an interactive user interface.

2. The method of claim 1, wherein the deterministic rules apply one or more tests to characteristics of the defects, and wherein the characteristics comprise whether the defects are bright or dark, contrast of the defects with respect to background, measured size, detection method, information about defects on other levels of the specimen, location of the defects on the specimen, proximity to other events, or some combination of attributes that can be used deterministically to classify defects.

3. The method of claim 1, wherein the statistical rules are based on characteristics of the defects comprising color, size, edge sharpness, eccentricity, roundness, transparency, texture, context, or some combination thereof, and wherein the statistical rules apply the characteristics statistically to bin defects.

4. The method of claim 1, wherein characteristics of the defects input to the statistical rules and the deterministic rules used for said applying are selected by a user.

5. The method in claim 1, wherein the another portion of the sequence of rules comprises rules based on proximity of the defects to other defects on the specimen or previous specimen history, and wherein dependent rules are applied after the another portion is applied.

6. The method of claim 1, wherein said applying is performed while a user is reviewing the defects.

7. The method of claim 1, further comprising tuning inspection recipes based on the results of said classifying.

8. The method of claim 1, further comprising using the results of said classifying in sampling defects for a subsequent activity.

9. The method of claim 1, further comprising performing engineering analysis using the results of said classifying.

10. The method of claim 1, further comprising performing the computer-implemented method on data generated by different inspection or review tools having different hardware configurations.

11. The method of claim 1, wherein said classifying comprises determining if the defects are nuisance defects based on results of said applying the deterministic rules or a combination of the deterministic and statistical rules.

12. The method of claim 1, wherein the statistical rules and the hybrid statistical and deterministic rules are organized into groups for selection to aid in user understanding of these rules and to provide classifications that reflect intent of a user.

13. The method of claim 1, wherein the statistical rules are weighted separately.

14. The method of claim 1, wherein the sequence of rules is organized by a user working with the interactive user interface, and wherein the sequence of rules is represented in the interactive user interface as a tree having different levels.

15. The method of claim 14, wherein the tree comprises nodes that produce one or more branches, one or more terminating bins, or some combination thereof.

16. The method of claim 14, wherein the tree comprises deterministic nodes, statistical nodes, or hybrid deterministic and statistical nodes.

17. The method of claim 14, wherein the tree comprises deterministic nodes designated by characteristic name, statistical nodes designated by name, and hybrid nodes designated by name.

18. The method of claim 14, wherein the interactive user interface illustrates the results of said classifying graphically and with sample images.

19. The method in claim 14, further comprising building one of the deterministic rules using the interactive user interface through applying unrestricted Boolean operators to defect characteristics.

* * * * *